US012160249B2

(12) United States Patent
Zhao et al.

(10) Patent No.: US 12,160,249 B2
(45) Date of Patent: Dec. 3, 2024

(54) PROGRAMMABLE DIGITAL-TO-ANALOG CONVERTER DECODER SYSTEMS AND METHODS

(71) Applicant: Apple Inc., Cupertino, CA (US)

(72) Inventors: Yi Zhao, San Jose, CA (US); David M. Signoff, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/338,920

(22) Filed: Jun. 21, 2023

(65) Prior Publication Data

US 2023/0336186 A1 Oct. 19, 2023

Related U.S. Application Data

(63) Continuation of application No. 17/471,786, filed on Sep. 10, 2021, now Pat. No. 11,700,011.

(51) Int. Cl.
*H04B 1/40* (2015.01)
*H03M 1/74* (2006.01)
*H03K 19/20* (2006.01)

(52) U.S. Cl.
CPC ............... *H03M 1/74* (2013.01); *H04B 1/40* (2013.01); *H03K 19/20* (2013.01)

(58) Field of Classification Search
CPC ........... H03B 5/02; H03K 19/20; H03M 1/00; H03M 1/66; H03M 1/68; H03M 1/74; H03M 1/76; H03M 3/00; H04B 1/04; H04B 1/40; H04L 27/04; H04N 5/33

USPC ......... 375/219, 295; 341/110, 144, 148, 150
See application file for complete search history.

(56) References Cited

U.S. PATENT DOCUMENTS

| 11,336,293 | B1 | 5/2022 | Passamani | |
|---|---|---|---|---|
| 11,700,011 | B2* | 7/2023 | Zhao | H04B 1/40 |
| | | | | 375/219 |
| 2006/0285094 | A1 | 12/2006 | Reijnen et al. | |
| 2014/0146914 | A1 | 5/2014 | Kuttner et al. | |
| 2022/0200583 | A1 | 6/2022 | Gruber et al. | |
| 2023/0071628 | A1* | 3/2023 | Koo | H03M 1/0845 |

\* cited by examiner

*Primary Examiner* — Shawkat M Ali
(74) *Attorney, Agent, or Firm* — Fletcher Yoder P.C.

(57) ABSTRACT

A number of unit cells of a digital-to-analog converter (DAC) may be simultaneously activated to generate an analog signal. However, while each unit cell may be generally the same, there may be variations such as non-linearity or noise in the analog output depending on which unit cells are activated for a given digital signal value. For example, as additional unit cells are activated for increased values of the analog signal, the fill order in which the unit cells are activated may affect the linearity/noise of the DAC. The decision units may be programmable to select which branches of the fractal DAC to activate, changing the fill order based on a fill-selection signal. The fill order may be set by a fill controller via the fill-selection signal to account for manufacturing variations, gradients in the supply voltage, output line routing, and/or environmental factors such as temperature.

20 Claims, 12 Drawing Sheets

PROGRAMMABLE DIGITAL-TO-ANALOG CONVERTER DECODER SYSTEMS AND METHODS

CROSS-REFERENCE TO RELATED APPLICATION

This application is a continuation of U.S. application Ser. No. 17/471,786, entitled "PROGRAMMABLE DIGITAL-TO-ANALOG CONVERTER DECODER SYSTEMS AND METHODS," filed on Sep. 10, 2021, which is herein incorporated by reference in its entirety.

BACKGROUND

This disclosure generally relates to digital-to-analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, the physical and/or logical layout of unit cells within a DAC may alter the data path length to each unit cell and/or the number of circuitry components traversed by the digital signal, which may affect the speed of operation of the DAC and/or the linearity of the DAC. Furthermore, the unit cells that are selected to be activated for a given digital signal may further affect the linearity and/or noise of the DAC output.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device may include one or more antennas and a transceiver coupled to the one or more antennas. The transceiver may include a digital-to-analog converter having multiple cells and decoders. Additionally, each decoder may be coupled to a subset of the cells and include selection circuitry coupled to an array of AND-OR-Inverter logics.

In another embodiment, a method may include receiving, via a digital-to-analog converter, a fill order signal and a digital signal corresponding to an analog output signal. The method may also include at least partially decoding, via a decision unit of the digital-to-analog converter, the digital signal to generate at least two decision unit outputs. The decision unit may also facilitate selecting an output direction for each of the at least two decision unit outputs based on the fill order signal.

In yet another embodiment, a digital-to-analog converter may include a unit cell array comprising multiple unit cells, a branching data path coupled to the unit cells, and multiple decision units disposed along the branching data path and communicatively coupled to the unit cells. Each decision unit may include a first input coupled to an incoming branch of the branching data path, a second input to receive a branch selection signal, and at least two outputs coupled to different outgoing branches of the branching data path. The decision units may also include path selection circuitry to direct each of a first output and a second output to the different outgoing branches of the branching data path based at least in part on the branch selection signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
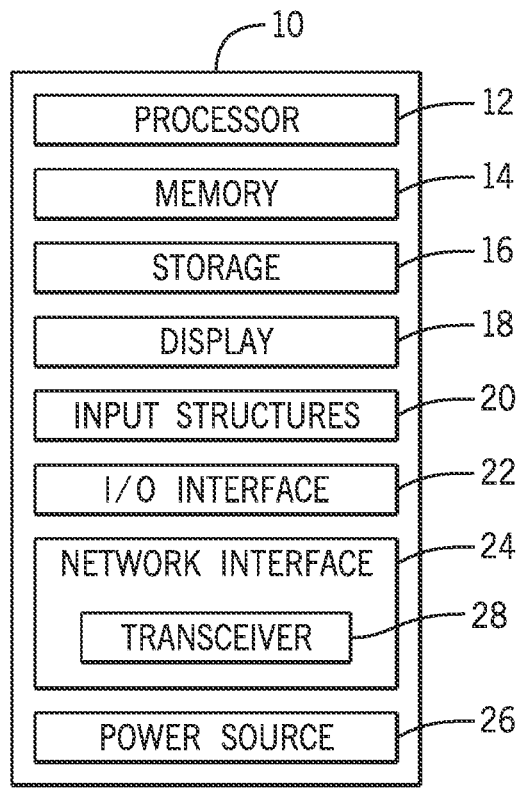
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

An electronic device may use one or more digital-to-analog converters (DACs) to convert digitally coded data (e.g., coded via binary code, grey-code, thermometer code, etc.) to a corresponding analog output voltage. For example, radio frequency (RF) signals may be generated to allow for wireless communications of the electronic device. In general, DACs may generate an analog electrical signal by switching on one or more unit cells outputting a unit level current or voltage that, in the aggregate, forms the analog electrical signal. In some scenarios, the physical and/or logical layout of the unit cells may alter the data path length to each unit cell and/or the number of circuitry components traversed by the digital signal, which may affect the speed of operation of the DAC and/or the linearity of the DAC. For example, a column and line DAC may use multiple decision units in parallel to decipher, reprocess, and/or combine digital data to control operation of unit cells to generate an analog signal. However, the logical layout of the column and line decision units, as well as the physical layout of the column and line unit cells, may create varying data path lengths to the unit cells, as well as more complicated and/or slower control logic operation, than that of a fractal DAC. This may lead to phase delays and/or synchronicity problems when compared to the fractal DAC.

In some embodiments, a fractal arrangement of unit cells and/or the transmission lines thereto into branches may assist in unifying the data path length to each of the unit cells, which may result in increased speed (e.g., operating frequency) of the DAC, increased linearity, better synchronous performance, and/or potential power savings. For example, as opposed to column and line DACs, where the data path to different unit cells may vary, a fractal DAC may have a static path length for the incoming data to each of the unit cells. In other words, each branch of the fractal layout tree may have equal length from the input to the unit cells. As such, there is reduced or minimized waiting between moments when activation signals arrive at the unit cells to be activated for a given data value. Additionally, the simplified distribution (e.g., via sequential decision units) of the incoming data to the unit cells may be further simplified by limiting or eliminating gate cells and/or reprocessing or recombining the data signals, which may further increase speed capabilities (e.g., operating frequency) and/or linearity (e.g., decreased differential nonlinearity (DNL) and/or integral nonlinearity (INL)) of the DAC. Moreover, due to the sequential nature of the decision units governing the unit cells, some signals (e.g., a clock signal, a phase signal, etc.) may be turned off when it is known that no further unit cells will be needed in a particular branch yielding increased power savings.

Additionally, in some embodiments, the unit cells of the DAC may operate according to thermometer coding decoded by the sequential decision units along the fractal layout tree. In some embodiments, the decision units may be disposed at branch points of the fractal DAC and facilitate decoding a digital signal into the thermometer coded data for the unit cells. The thermometer coding may facilitate simplified operation of the unit cells by correlating a single digit value (e.g. a logical high or logical low value) to each unit cell.

During operation, a number of unit cells corresponding to the input digital signal may be simultaneously activated to generate the analog signal. However, while each unit cell may include generally the same components and have generally the same dimensions (e.g., within manufacturing tolerances), there may be variation (e.g., non-linearity, noise, etc.) in the analog output based on a selection of the unit cells to be activated for a given digital signal value. For example, as additional unit cells are activated for increased values of the analog signal, the fill order in which the unit cells are activated may affect the linearity/noise of the DAC. In some embodiments, the decision units may be programmable to select branches of the fractal DAC to be activated, changing the fill order based on a fill-selection signal. The fill order may be set by a fill controller via the fill-selection signal to account for manufacturing variations, gradients in the supply voltage, output line routing, and/or environmental factors such as temperature.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11x family of protocols (e.g., WI-FI®), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-252 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
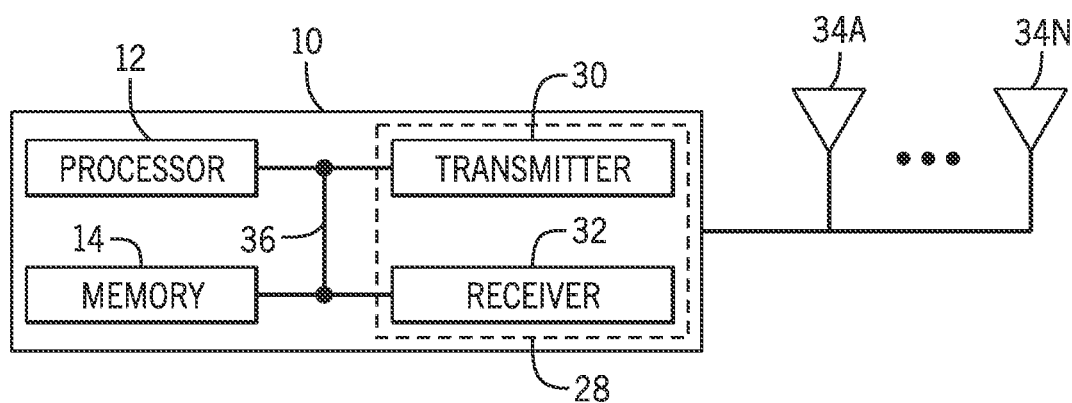
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
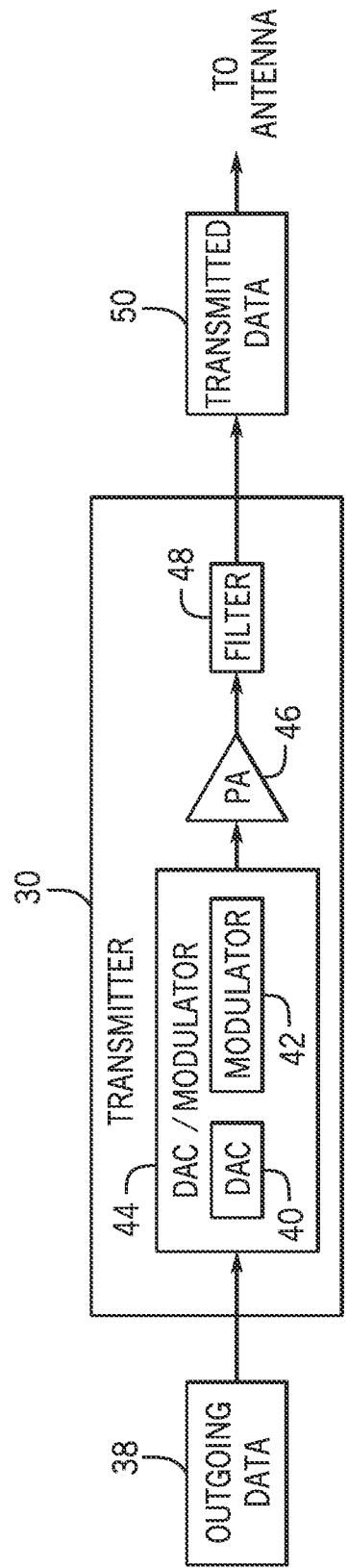
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive outgoing data 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously and/or within the same circuitry. Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, DAC 40 may refer to a standalone DAC 40 or a combined DAC/modulator 44. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate transmitted data 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter. Additionally, the transmitter 30 may include any suitable additional components not shown, or may not include certain of the illustrated components, such that the transmitter 30 may transmit the outgoing data 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
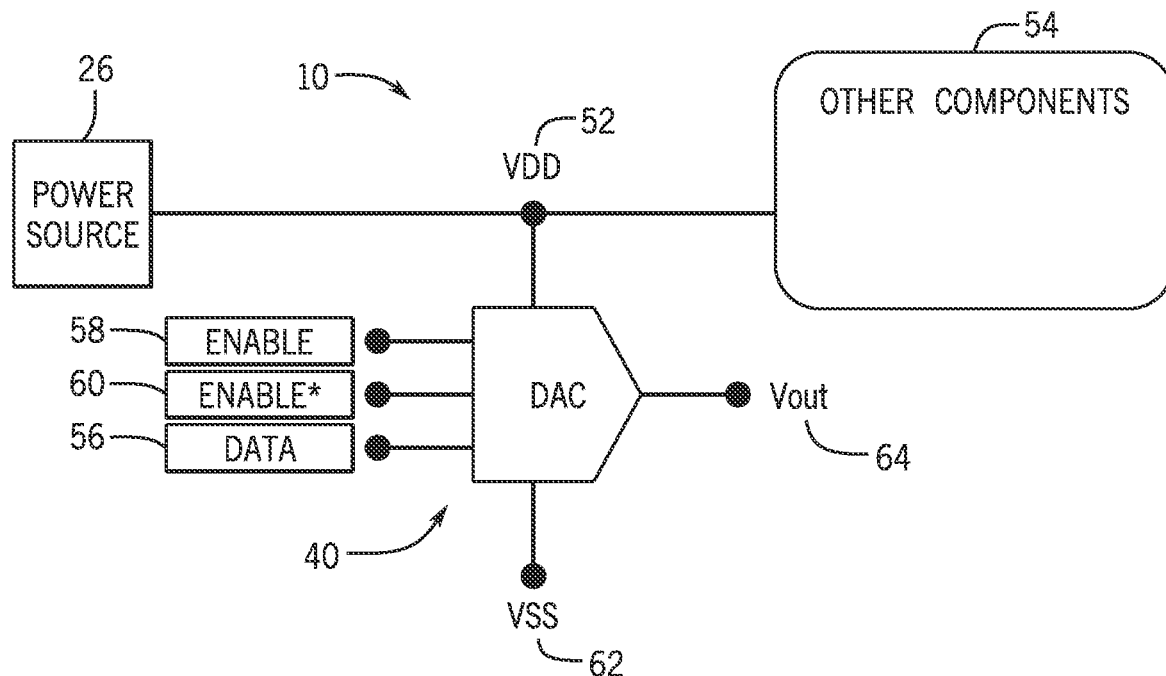
FIG. 4 is a schematic diagram of a portion of the electronic device of FIG. 1 including the digital-to-analog converter of FIG. 3, in accordance with an embodiment of the present disclosure.

FIG. 4 is a schematic diagram of a portion of the electronic device 10 having a DAC 40, according to an embodiment of the present disclosure. In some embodiments, the DAC 40 may share a supply voltage (e.g., VDD) 52 provided by the power source 26 with other components 54 of the electronic device 10. For example, the other components 54 may include any powered electronic component of the electronic device 10 utilizing the supply voltage 52 or a derivative thereof. Moreover, the DAC 40 may receive the digital signal 56 (e.g., of outgoing data 38), an enable signal 58, and/or a complementary enable signal 60. The enable signal 58 and/or the complementary enable signal 60 may enable and/or facilitate enabling operation of the DAC 40. For example, if the enable signal 58 is logically "low" relative to a reference voltage 62 (e.g., ground or other relative voltage), then the DAC 40 may be disabled or inactive. On the other hand, if the enable signal 58 is logically "high" (e.g., relative to the reference voltage 62 and/or the supply voltage 52), then the DAC 40 may be enabled or active for operation. Furthermore, the reference voltage 62 (e.g., VSS) may be provided as a reference for the digital signal 56, the enable signal 58, the complementary enable signal 60, the supply voltage 52, and/or the analog output signal 64. As should be appreciated, and as used herein, signals (e.g., the digital signal 56, the enable signal 58, the complementary enable signal 60, the analog output signal 64, etc.) may correspond to voltages and/or currents relative to a reference and may represent electronically storable, displayable, and/or transmittable data.

As discussed herein, the different analog output signals 64 generated by the DAC 40 may correspond to values of the digital signal 56. The digital signal 56 and corresponding analog output signal 64 may be associated with any suitable bit-depth depending on implementation. For example, in the context of image data (e.g., in a baseband DAC) and/or signal transmission data (e.g., in an RF DAC), an 8-bit digital signal 56 may correspond to 255 or 256 analog output signals 64.

Figure 5:
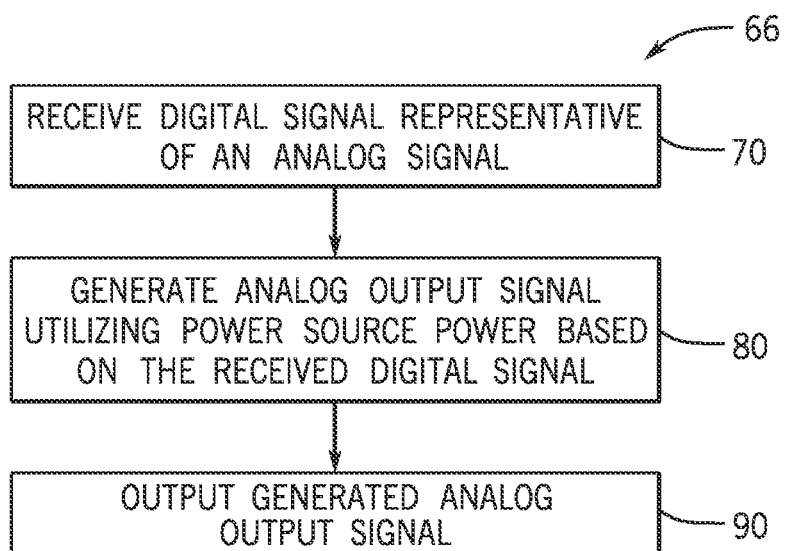
FIG. 5 is a flowchart of a method for converting a digital signal to an analog signal using the digital-to-analog converter of FIG. 4, in accordance with an embodiment of the present disclosure.

FIG. 5 is a flowchart of a method 66 for converting a digital signal to an analog signal using the DAC 40, according to an embodiment of the present disclosure. In general, the DAC 40 may receive a digital signal 56 representative of an analog signal (process block 70). The DAC 40 may also generate an analog output signal 64 (as discussed in further detail below), utilizing power from the power source 26, based on the received digital signal 56 (process block 80). The generated analog output signal 64 may then be output from the DAC 40 (processing block 90).

Figure 6:
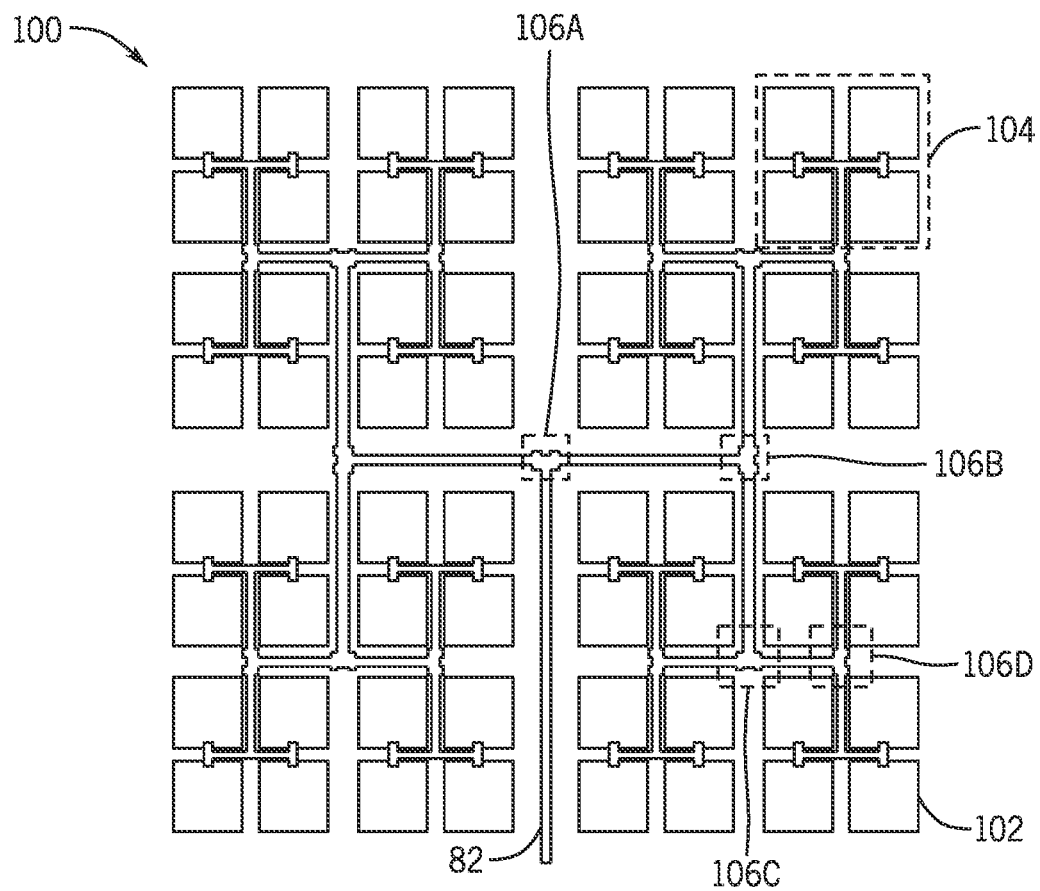
FIG. 6 is a schematic diagram of a fractal digital-to-analog converter, in accordance with an embodiment of the present disclosure.

As discussed above, DACs 40 may generate an analog output signal 64 by enabling one or more unit cells to output a unit amount of current or voltage that, in the aggregate, forms the analog output signal 64. The unit current or voltage may be predetermined and based on implementation factors. For example, the unit cells may include one or more capacitors that store a fixed amount of charge that may be released to form the analog output signal 64. In some scenarios, the physical and/or logical layout of the unit cells may affect the speed of operation of the DAC and/or the linearity of the DAC. As such, in some embodiments, one or more DACs 40 of the electronic device 10 may be implemented as a fractal DAC 100, as illustrated in FIG. 6. A fractal DAC 100 may include multiple unit cells 102 arranged (e.g., logically and/or physically) in a fractal pattern constructed of fractal blocks 104. Moreover, the illustrated pattern may be replicated by replacing each unit cell 102 with a fractal block 104 to realize a fractal DAC of increased size while maintaining symmetry.

In the illustrated example, the fractal DAC 100 includes sixteen fractal blocks 104 of four unit cells 102, which may correspond to, for example, sixty-four different analog output signals 64 (e.g., which may have non-zero values). However, larger fractal DACs may be envisioned by replacing each unit cell 102 with a fractal block 104, increasing the size of the fractal DAC 100 by four each time to maintain $4^x$ unit cells 102 (where x is the number of fractal blocks 104 in the fractal DAC 100). As should be appreciated, the size of the fractal DAC 100 may depend on implementation factors such as desired granularity of the analog output signal 64. Furthermore, different size fractal blocks 104 (e.g., half of a fractal block 104) may be used to achieve different numbers of total unit cells 102 (e.g., $2^x$ number of unit cells 102 for fractal blocks 104 having a size of two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential nonlinearity (DNL) and/or integral nonlinearity (INL).

In some embodiments, the multiple nested fractal blocks 104 may be continuously split into symmetrical branches by decision units 106 (e.g., 106A, 106B, 106C, 106D, etc.) until reaching the unit cells 102. That is, for a given branch of the fractal DAC 100, sequential decision units 106 may be used to interpret and decode the digital signal 56 and direct enable/disable signals to the corresponding unit cells 102 to generate the analog output signal 64. Additionally, although the digital signal 56 is depicted as a single line, in some embodiments, the digital signal 56 may include multiple data buses running in parallel through the fractal DAC 100. For example, the multiple data buses may include data for multiple phases and/or polarity (e.g., negative and positive). As such, the fractal DAC 100 and the decision units 106 may operate using multiple digital signals 56 in parallel to control outputs of the unit cells 102.

Figure 7:
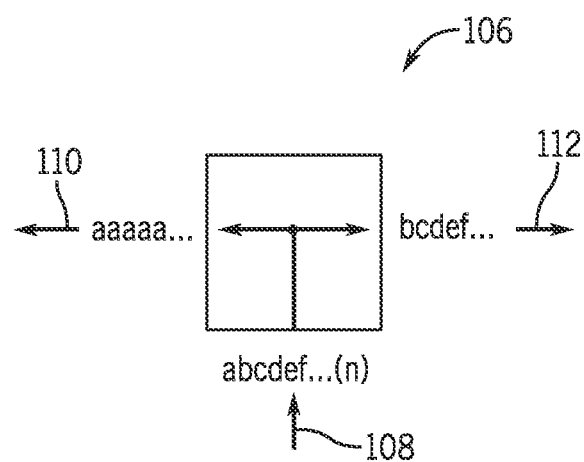
FIG. 7 is a schematic diagram of a decision unit of the fractal digital-to-analog converter of FIG. 6, in accordance with an embodiment of the present disclosure.

To help illustrate, FIG. 7 is an example decision unit 106 receiving an incoming signal 108 of n bits, according to an embodiment of the present disclosure. In some embodiments, the incoming signal 108 (e.g., the digital signal 56) is a binary signal that is decoded step-by-step by the sequential decision units 106, such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the thermometric digital signal (e.g., with logical "1" or high going to two unit cells 102 for activation and logical "0" or low going to two different unit cells 102 for deactivation). For example, the incoming signal 108 may have n-bits (e.g., abcdef . . . , where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits. As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth.

Additionally, although depicted in FIGS. 6 and 7 as having two outputs (e.g., MSb signal 110 and LSb signal 112), in some embodiments, the decision units 106 may evaluate multiple bits of the incoming signal 108 at the same time. For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 56 (e.g., via the decision units 106) into a thermometric signal dispersed among the unit cells 102. Additionally or alternatively, the digital signal 56 may include a binary signal that is not decoded via the decision units 106. For example, some unit cells 102 may have a binary-sized output that is dependent upon a binary signal. In some embodiments, the binary signal (e.g., a portion of the digital signal 56) may traverse the same path as the decoded thermometric signal and therefore have substantially similar arrival time at the binary coded unit cells 102, maintaining synchronicity of the fractal DAC 100. For example, the binary signal may be passed through or bypass the decision units 106 and/or use separate distribution logic following the data path of the fractal DAC 100. The binary coded unit cells 102 may use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level (e.g., 0.25, 0.5, or 0.75 of a unit voltage or current). The binary-sized output of the binary coded unit cells 102 may facilitate increasing resolution of the analog output signal 64 by providing increased granularity.

Figure 8:
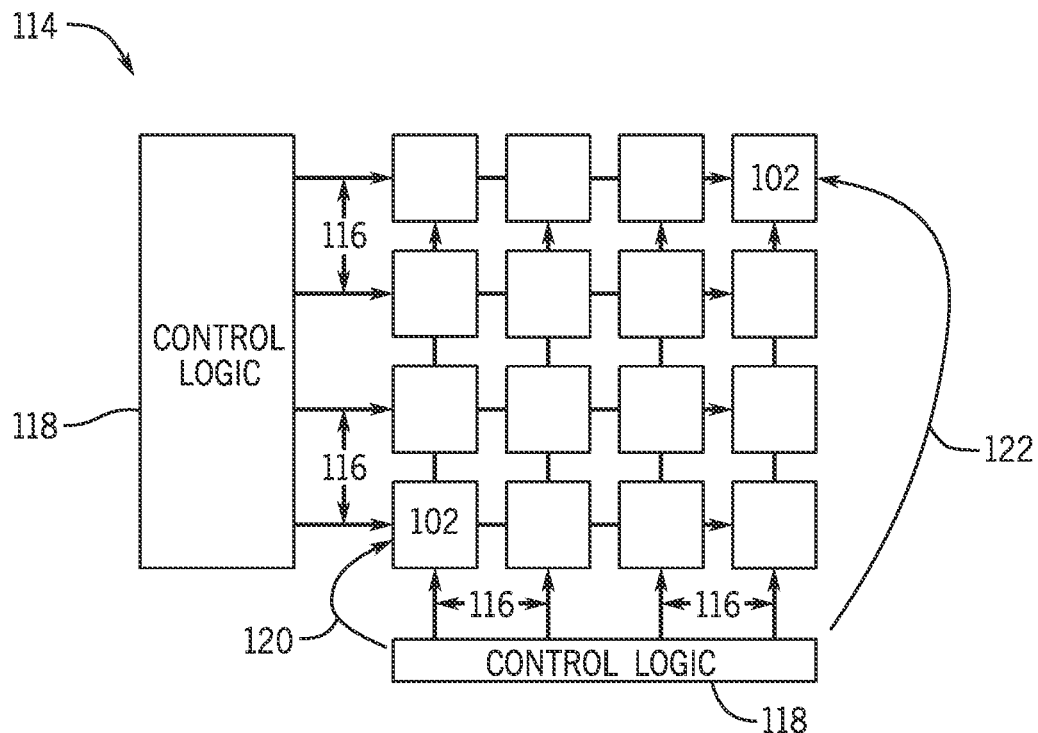
FIG. 8 is a schematic diagram of a column and line digital-to-analog converter, in accordance with an embodiment of the present disclosure.

The fractal DAC 100 may provide increased benefits (e.g., increased speed, increased linearity, decreased DNL, and/or decreased INL) over other forms of DACs such as a column and line DAC 114, as shown in FIG. 8. In some scenarios, the column and line DAC 114 may include a multitude of control signals 116 from control logic 118 feeding an array of unit cells 102. Moreover, while the control logic 118 of the column and line DAC 114 may be non-uniform and have more complex control signals 116, the fractal DAC 100, as discussed herein, may include repeated or reproduced decision units 106 with simplified outputs (e.g., the MSb signal 110 and the LSb signal 112). For example, the control logic 118 of the column and line DAC 114 may incorporate binary to thermometric conversion and/or take into consideration the desired states of multiple individual unit cells 102 concurrently or simultaneously to determine control signals 116 necessary for operation. On the other hand, the simplified decision units 106 may operate faster than control logic 118 of a column and line DAC 114 due to the simplified set of inputs and outputs. Furthermore, the linear nature of the data lines and decision units 106 of a fractal DAC 100 may result in fewer errors and/or less effect when errors, such as mistaken logical values, occur. Additionally, in some embodiments, each decision unit 106 of a fractal DAC 100 may have substantially the same components and/or dimensions, simplifying manufacturing. Moreover, one or more decision units 106 may be implemented while reducing or eliminating gate logic to further increase operating speed.

In some scenarios, the location of the decision units 106 within the array of unit cells 102 may increase the size the array. However, due at least in part to the reduced complexity of the control circuitry (e.g., the decision units 106 compared to the control logic 118), the internalization of the decision units 106 with the array of unit cells 102 may result in an overall smaller DAC 40 by reducing or eliminating control logic 118 exterior to the array of unit cells 102.

In addition to providing a simplified manufacturing, simplified operation, decreased size, and/or increased speed of operation, the fractal DAC 100 may include data paths (physically and/or logically) to each unit cell 102 that are substantially of the same dimensions, components, and/or number of components, which may further increase linearity and/or synchronicity. For example, returning briefly to FIG. 6, starting from the incoming digital signal 56 and the first decision unit 106A, the data path to each unit cell 102 and the number of decision units 106 traversed along the data path is the same for each unit cell 102. As should be appreciated, in some embodiments, some data paths of a fractal DAC 100 may differ due to manufacturing tolerances, physical layout constraints, data-line-to-data-line coupling, and/or additional implementation factors and interference.

On the contrary, other DACs, such as the column and line DAC 114 depicted in FIG. 8, may have shorter paths (e.g., data path 120) and longer paths (e.g., data path 122). In some scenarios, the disparate physical lengths and/or disparate logical circuitry traversed in a column and line DAC 114 may result in the column and line DAC 114 waiting until a specified time to allow for the control signals 116 to traverse the longer paths (e.g., data path 122). However, in some embodiments, a fractal DAC 100 may include data paths that are substantially the same, innately providing the decoded incoming signal 108 to each of the unit cells 102 concurrently or at substantially the same time. In other words, the substantially similar data paths of the fractal DAC 100 may reduce or eliminate a wait time associated with the difference between shorter and longer data paths (e.g., the difference between data path 120 and data path 122), further increasing the operable speed of the fractal DAC 100.

Figure 9:
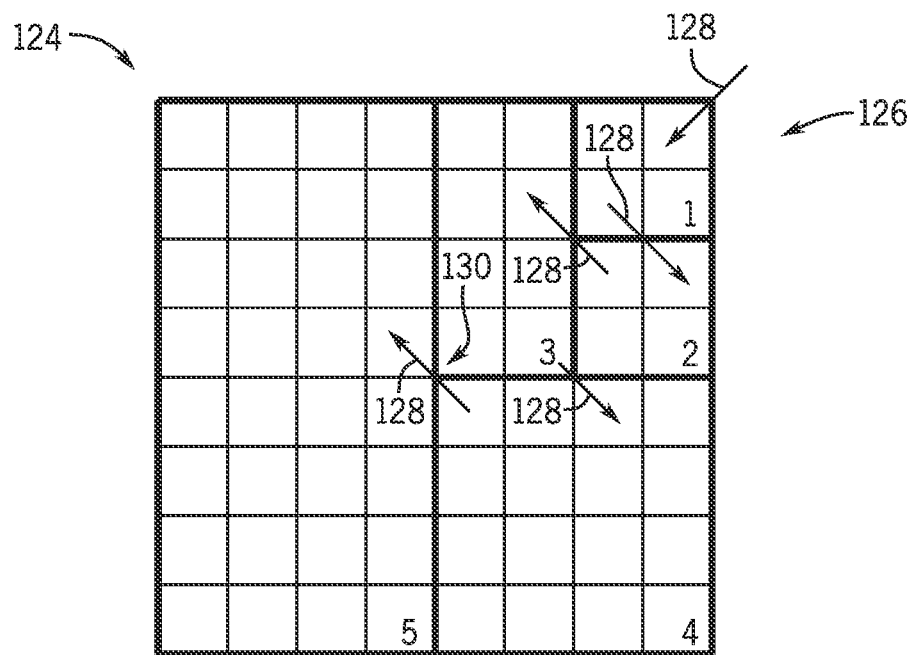
FIG. 9 is a schematic diagram of a fill order of the fractal digital-to-analog converter of FIG. 6, in accordance with an embodiment of the present disclosure.

As discussed above, the decision units 106 may output an MSb signal 110 and an LSb signal 112 in different directions to different sections of the fractal DAC 100. In some embodiments, the directions of the outputs of the decision units 106 and the unit cells 102 themselves may be organized such that unit step increases in the output of the fractal DAC 100 enable unit cells 102 that are physically adjacent (e.g., laterally, vertically, or diagonally). To help illustrate, FIG. 9 depicts a fill order of sequentially increasing activations of a unit cell array 124, according to an embodiment of the present disclosure. As used herein, chronological (e.g., before, after, and/or sequential) activation of the unit cells 102 may be considered over multiple cycles of digital signal 56, as the unit cells 102 may be enabled/disabled concurrently or substantially simultaneously for a given digital signal 56. In some embodiments, the filling order of the unit cell array 124 may begin at a corner 126 and propagate through the unit cell array 124 as depicted by the fill arrows 128. For example, the unit cells 102 of block 1 (depicted with 2×2 unit cells) may be enabled prior to the unit cells 102 of block 2 (depicted with 2×2 unit cells) in response to the digital signal 56 increasing to include more than four unit cells 102, followed by enablement of the unit cells 102 in block 3 (depicted with 2×4 unit cells), block 4 (depicted with 4×4 unit cells), and block 5 (depicted with 4×8 unit cells). In some embodiments, the fill order may include crossing points at edges of subsequent fractal blocks 104 (e.g., at fill arrow 128 locations). Within the fractal blocks 104, the fill order may progress in a spiral, zig-zag, linear, or other pattern.

By sequentially adding (e.g., in response to an increasing digital signal 56) adjacent unit cells 102 to the previously activated unit cells 102, the fractal DAC 100 may exhibit improved linearity (e.g., decreased DNL and/or INL). For example, utilizing immediately adjacent (e.g., directly above, below, to the side, or diagonal to) unit cells 102 in transitioning from a first digital signal 56 to a second digital signal 56 may decrease an impact of process-gradients affecting the individual unit cells 102, which may lead to decreased DNL. As should be appreciated, the fill order illustrated in FIG. 9 is given as an example, and other fill orders may also be used that enable adjacent unit cells 102. For example, the fill order may begin at a center 130 of the unit cell array 124 and propagate through the unit cell array 124 filling one quadrant (e.g., block) at a time. Moreover, the depicted fill order may be reversed or otherwise altered while still maintaining the adjacency property of added unit cells 102.

As discussed above, a decision unit 106 may provide partial decoding of the digital signal 56 by sending a MSB signal 110 down one branch of the fractal DAC 100 and a LSB signal 112 down another branch. However, while each unit cell 102 may be generally have the same components and/or dimensions (e.g., within manufacturing tolerances), there may be variation (e.g., non-linearity, noise, etc.) in the analog output signal 64 depending on which unit cells 102 are activated for a given digital signal 56. In other words, the fill order may affect the linearity/noise of the DAC 40. In some embodiments, the fill order may be selected by utilizing programmable decision units 106 to select which branches of the fractal DAC 100 the MSB signal 110 and the LSB signal 112 will propagate.

Figure 10:
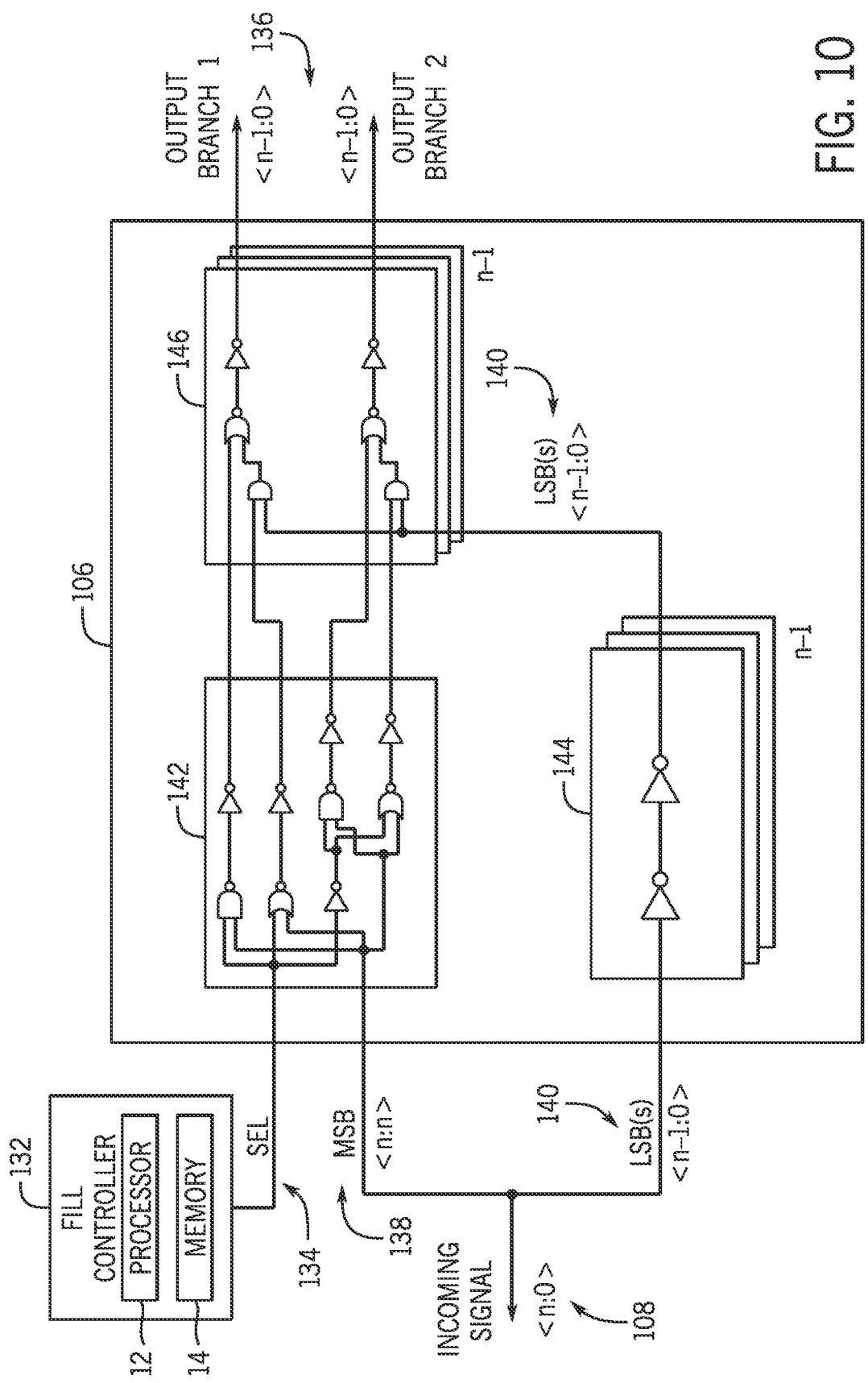
FIG. 10 is schematic diagram of a fill controller and an example decision unit of the fractal DAC of FIG. 6, in accordance with an embodiment of the present disclosure.

To help illustrate, FIG. 10 is a schematic diagram of a fill controller 132 and an example decision unit 106 of the fractal DAC 100, according to an embodiment of the present disclosure. The fill controller 132 may provide a branch selection signal 134, SEL, to each decision unit 106 to direct the MSB signal 110 and the LSB signal 112 to particular output branches 136 (e.g., output branch 1 and output branch 2). As discussed above, the incoming signal 108 may include n bits which may be divided into a MSB 138 and a set of n−1 LSB(s) 140. The MSB 138 may be processed by MSB circuitry 142, and the LSB(s) may be processed by LSB circuitry 144. In some embodiments, the MSB circuitry 142 may leverage both the branch selection signal 134 and the MSB 138 in one or more logical circuits, while the LSB circuitry 144 acts as a pass through (e.g., a pair of inverters or other buffer stage). Moreover, the LSB circuitry 144 and MSB circuitry 142 may include balanced amounts of circuitry to match or approximately match the path delay of the other. For example, the LSB circuitry 144 may include inverters, buffers, or other circuitry for each bit signal of the LSB(s) 140 to generate a signal delay equivalent or approximately equivalent (e.g., within the operating parameters of the implementation) to the signal delay of the MSB circuitry 142 operating on the MSB 138 and branch selection signal 134. As such, the outputs of the MSB circuitry 142 and the outputs of the LSB circuitry 144 may arrive at branch selection circuitry 146 concurrently or at substantially the same time. The branch selection circuitry 146 may utilize logical circuits such as an AND-OR-inverter to combine the outputs of the LSB circuitry 144 and the MSB circuitry 142 and output the MSB signal 110 and LSB signal 112 to the appropriate output branch 136 according to the branch selection signal 134. Moreover, while a single decision unit 106 receiving a single branch selection signal 134 is depicted, each decision unit 106 may receive the same or different branch selection signals 134 (e.g., cumulatively a fill order signal) according to the fill order determined or selected by the fill controller 132.

As should be appreciated, the MSB circuitry 142 may include a single set of logical circuits while the LSB circuitry 144 and the branch selection circuitry 146 may include an array of logical circuits corresponding to the number of bits. For example, an 8-bit incoming signal 108 may yield a MSB 138 and seven bits of LSBs 140. Accordingly, the LSB circuitry 144 and the branch selection circuitry 146 may each include an array of seven sets of logical circuits. As should be appreciated, the circuitry of FIG. 10 is given as a non-limiting example, and different layouts or logical circuits may be utilized to select the output branches 136. For example, the LSB circuitry 144 may leverage both the branch selection signal 134 and the LSB(s) 140 in one or more logical circuits, while the MSB circuitry 142 acts as a pass through for the MSB 138.

Figure 11:
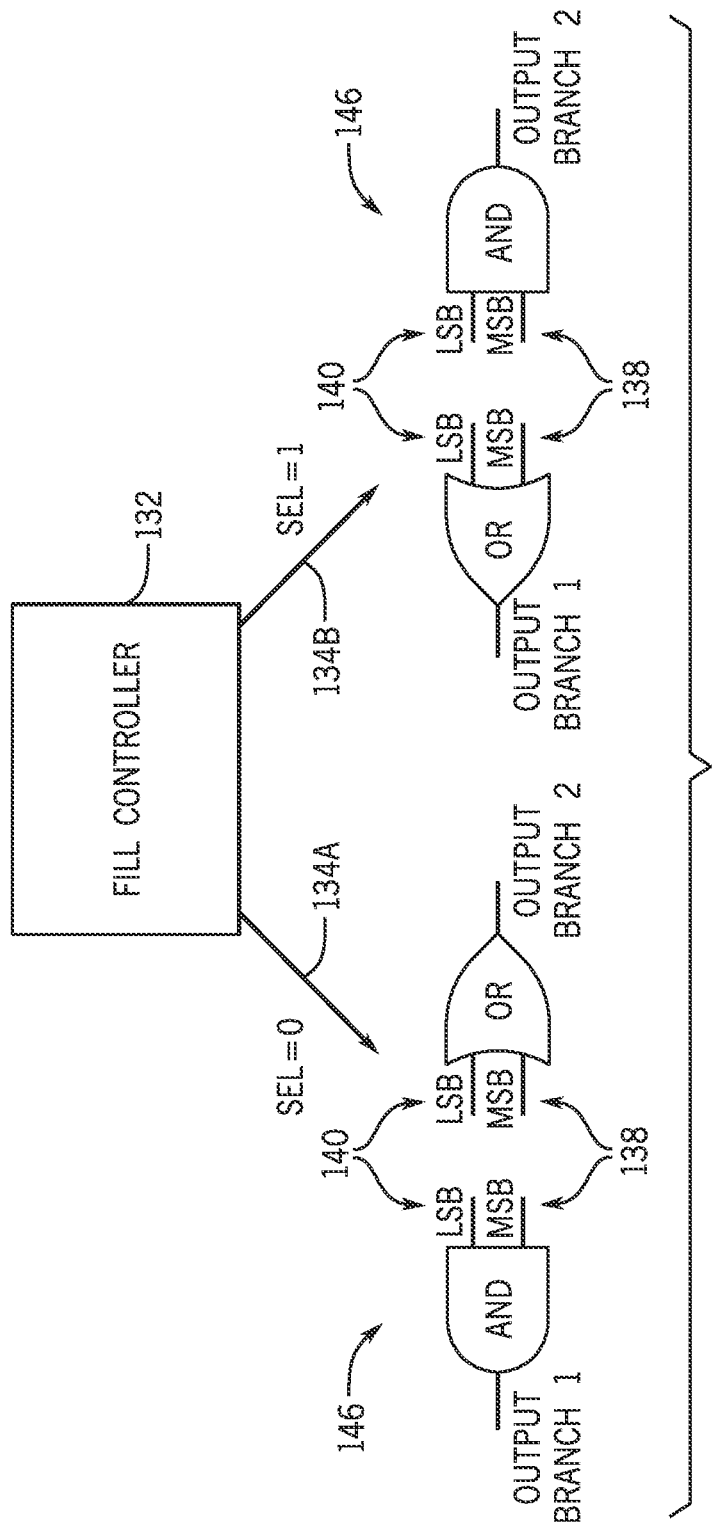
FIG. 11 is a functional diagram of branch selection circuitry, of the example decision unit of FIG. 10, having different functional properties in response to different branch selection signals, in accordance with an embodiment of the present disclosure.

To help further illustrate, FIG. 11 is a functional diagram of the branch selection circuitry 146 providing the output LSB signal 112 and MSB signal 110 to different output branches 136 in response to different branch selection signals 134, according to an embodiment of the present disclosure. In some embodiments, the branch selection circuitry 146 may functionally operate as an AND-OR-invertor sensitive to the branch selection signal 134. For example, in response to a logically low branch selection signal 134A, the branch selection circuitry 146 may operate in a first mode (e.g., as a logical AND gate) for output branch 1 and in a second mode (e.g., as a logical OR gate) for output branch 2. Conversely, in response to a logically high branch selection signal 134B, the branch selection circuitry 146 may operate in the second mode (e.g., as a logical OR gate) for output branch 1 and in the first mode (e.g., as a logical AND gate) for output branch 2. As should be appreciated, the logical circuitry of FIG. 11 is provided for illustrative purposes and is, as such, non-limiting. Moreover, additional and/or different logical circuitry may be utilized other than the depicted to generate and output the LSB signal 112 and the MSB signal 110 on the output branches 136 of the decision unit 106.

Figure 12:
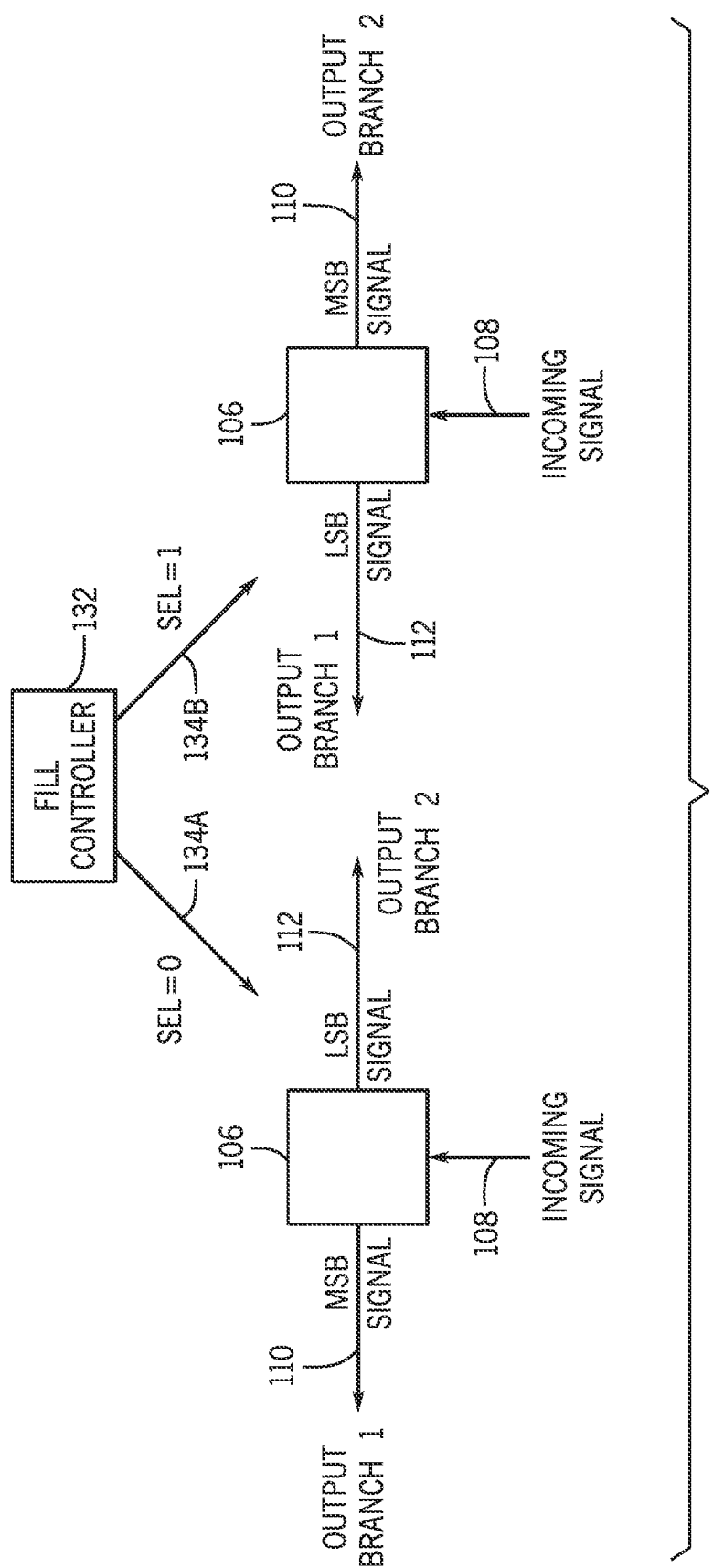
FIG. 12 is a functional diagram of different output branch scenarios associated with different branch selection signals from the fill controller of FIG. 10, in accordance with an embodiment of the present disclosure.
Figure 13:
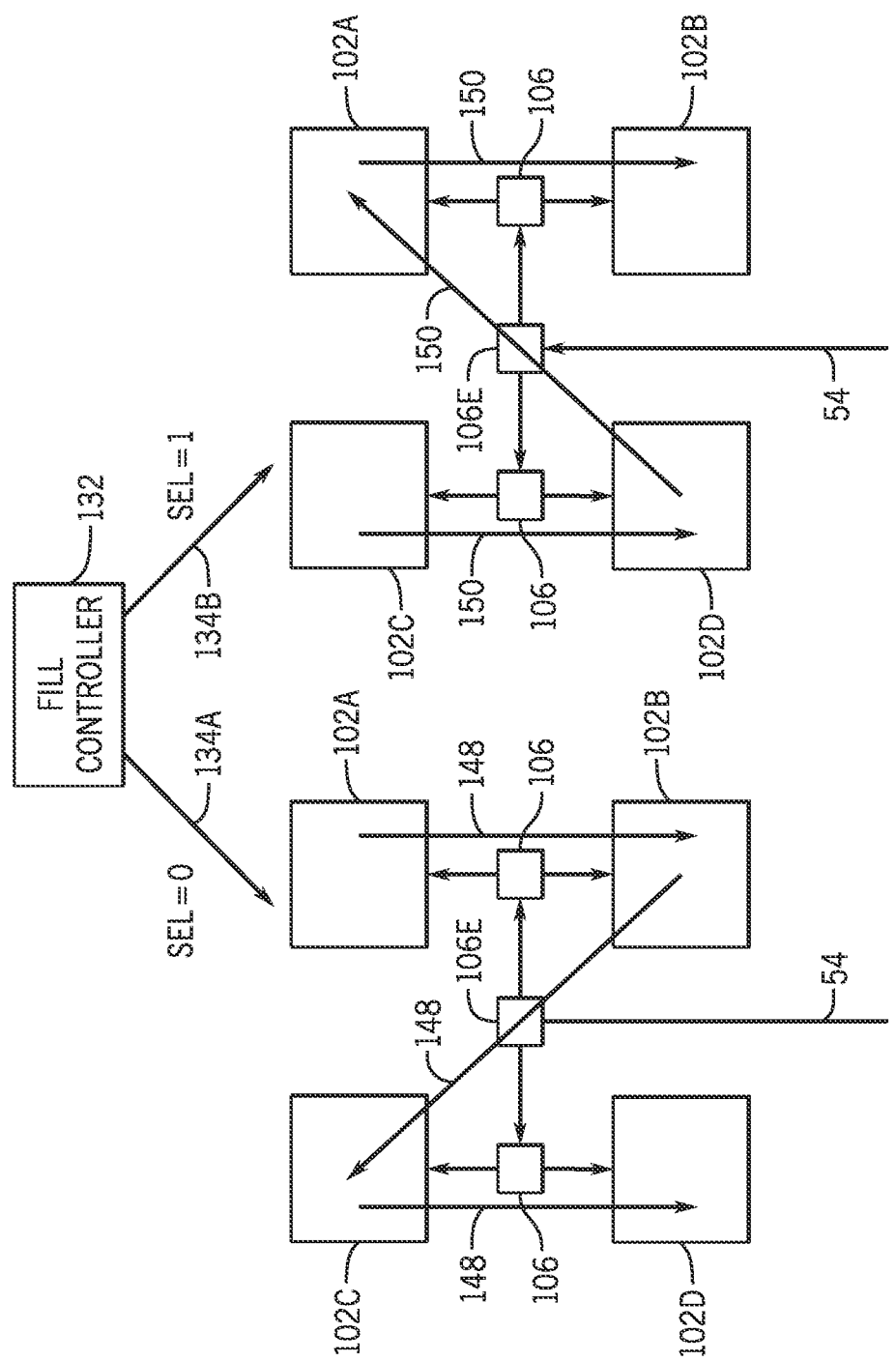
FIG. 13 is a schematic diagram of different fill orders associated with different branch selection signals received by the decision unit of FIG. 10, in accordance with an embodiment of the present disclosure.

FIG. 12 is a functional diagram of the different output branch scenarios of a decision unit 106 associated with different branch selection signals 134 from the fill controller 132, according to an embodiment of the present disclosure. By way of example, when the fill controller 132 provides a logically low branch selection signal 134A, the decision unit 106 outputs the MSB signal 110 to output branch 1 and the LSB signal 112 to output branch 2. Conversely, when the fill controller 132 provides a logically high branch selection signal 134B, the decision unit 106 outputs the MSB signal 110 to output branch 2 and the LSB signal 112 to output branch 1. To help illustrate the effect on fill order, FIG. 13 is a schematic diagram of different fill orders associated with different branch selection signals 134 applied to a particular decision unit 106A, according to an embodiment of the present disclosure. By way of example, when the fill controller 132 provides a logically low branch selection signal 134A, the fill order for a particular set of unit cells 102 (e.g., 102A, 102B, 102C, and 102D) may follow a first fill order 148 from unit cell 102A to unit cell 102B to unit cell 102C to unit cell 102D. Conversely, when the fill controller 132 provides a logically high branch selection signal 134B, the same set of unit cells 102 may follow a second fill order 150 from unit cell 102C to unit cell 102D to unit cell 102A to unit cell 102B.

The fill controller 132 may include one or more processors 12 and/or memory 14 to provide each decision unit 106 with a branch selection signal 134. In some embodiments, the fill controller 132 may be preset during manufacturing to provide a particular fill order. Additionally or alternatively, the fill controller 132 may be on-the-fly programmable or periodically programmed to change the fill order depending on environmental or situational parameters such as temperature, power usage, an operating frequency of the DAC 40, and/or other factors. Fill orders may also be changed to help reduce over or under utilization of any particular unit cells 102. Moreover, in some scenarios, different model electronic devices 10 may utilize different fill orders, and the fill controller 132 may be set accordingly. Due to such versatility, a fractal DAC 100 with a programmable fill order may be shared across multiple electronic devices 10 to aid in efficient manufacturing.

Figure 14B:
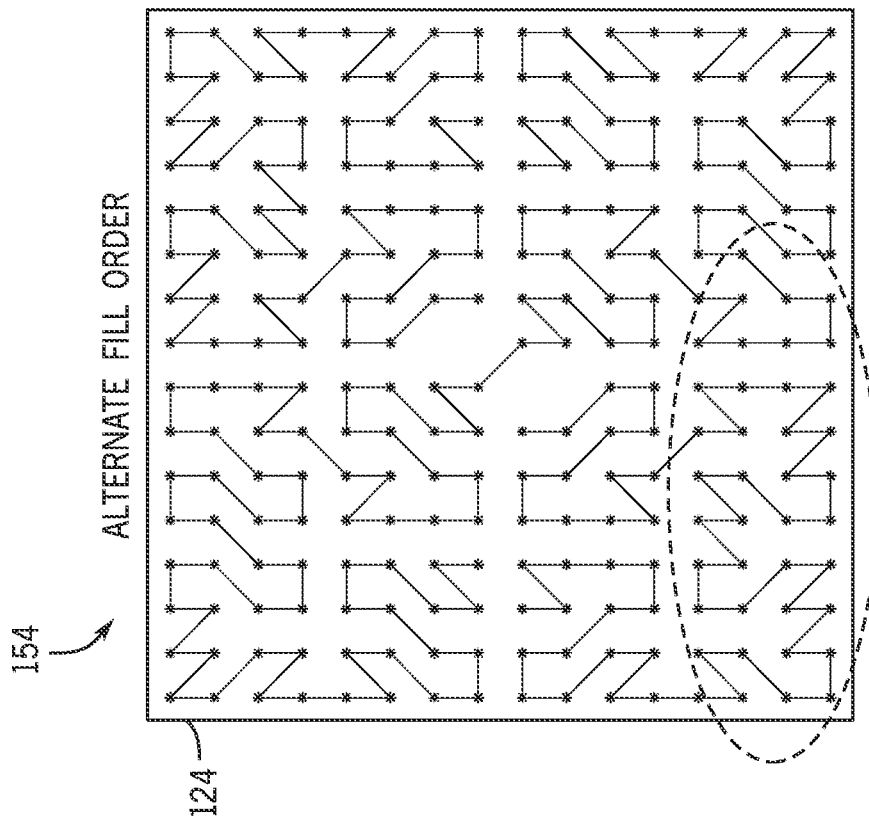
FIG. 14B is a schematic diagram of an example alternative fill order of the fractal digital-to-analog converter of FIG. 6, in accordance with an embodiment of the present disclosure.
Figure 14A:
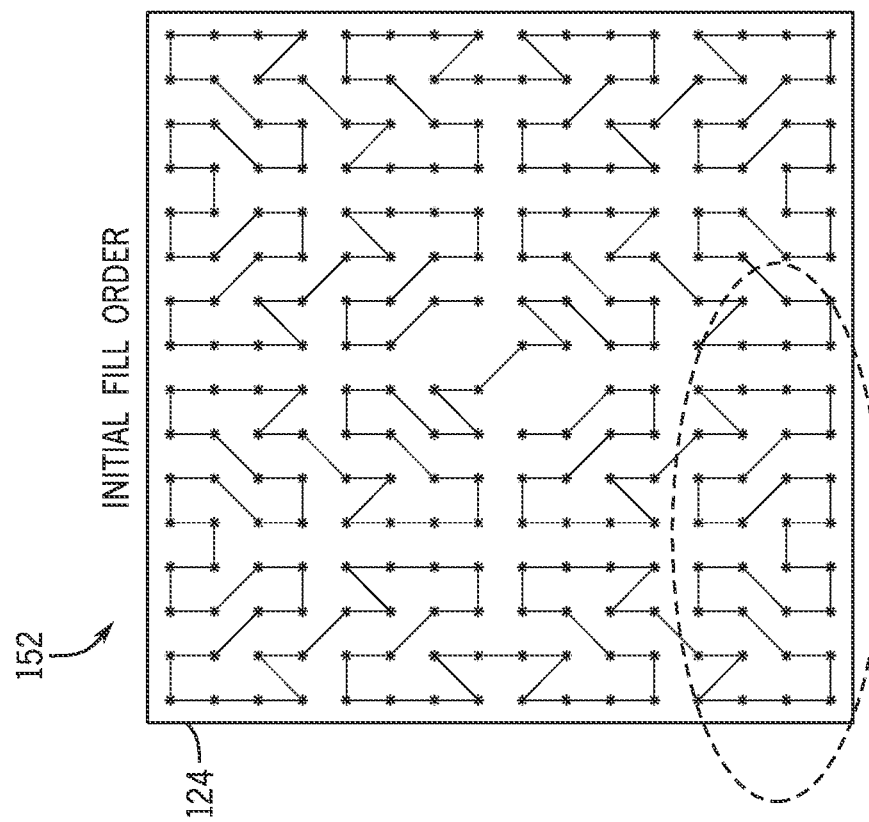
FIG. 14A is a schematic diagram of an example initial fill order of the fractal digital-to-analog converter of FIG. 6, in accordance with an embodiment of the present disclosure.

Additionally or alternatively to providing a different fill order for different models of electronic devices 10, the fill controller 132 may also be utilized to generate device specific fill orders. For example, manufacturing variations between electronic devices 10, even of the same model, may change the optimal fill order. As such, during or after manufacturing, the fill controller 132 may be utilized to test multiple different fill orders. The analog output signal 64 may be monitored for linearity and noise, and a fill order may be selected that best fits the operational circumstances. While FIG. 13 helps illustrate the changes in fill order due to the change of a single branch selection signal 134 at one decision unit 106, FIGS. 14A and 14B illustrate how the fill order of a full unit cell array 124 may change given different fill order signals. For example, FIGS. 14A and 14B depict an initial fill order 152 and an alternate fill order 154, respectively, with several different branch selection signals 134. In one embodiment, the initial fill order 152 may be determined based on historically optimized fill orders, and one or more alternate fill orders 154 may be tested for viability and/or improvement over the initial fill order 152. Indeed, as can be seen in the example areas of interest 156 (e.g., 156A and 156B, cumulatively 156), multiple changes to the fill order may be made with just a few changes to the branch selection signals 134 to the decision units 106.

Figure 15:
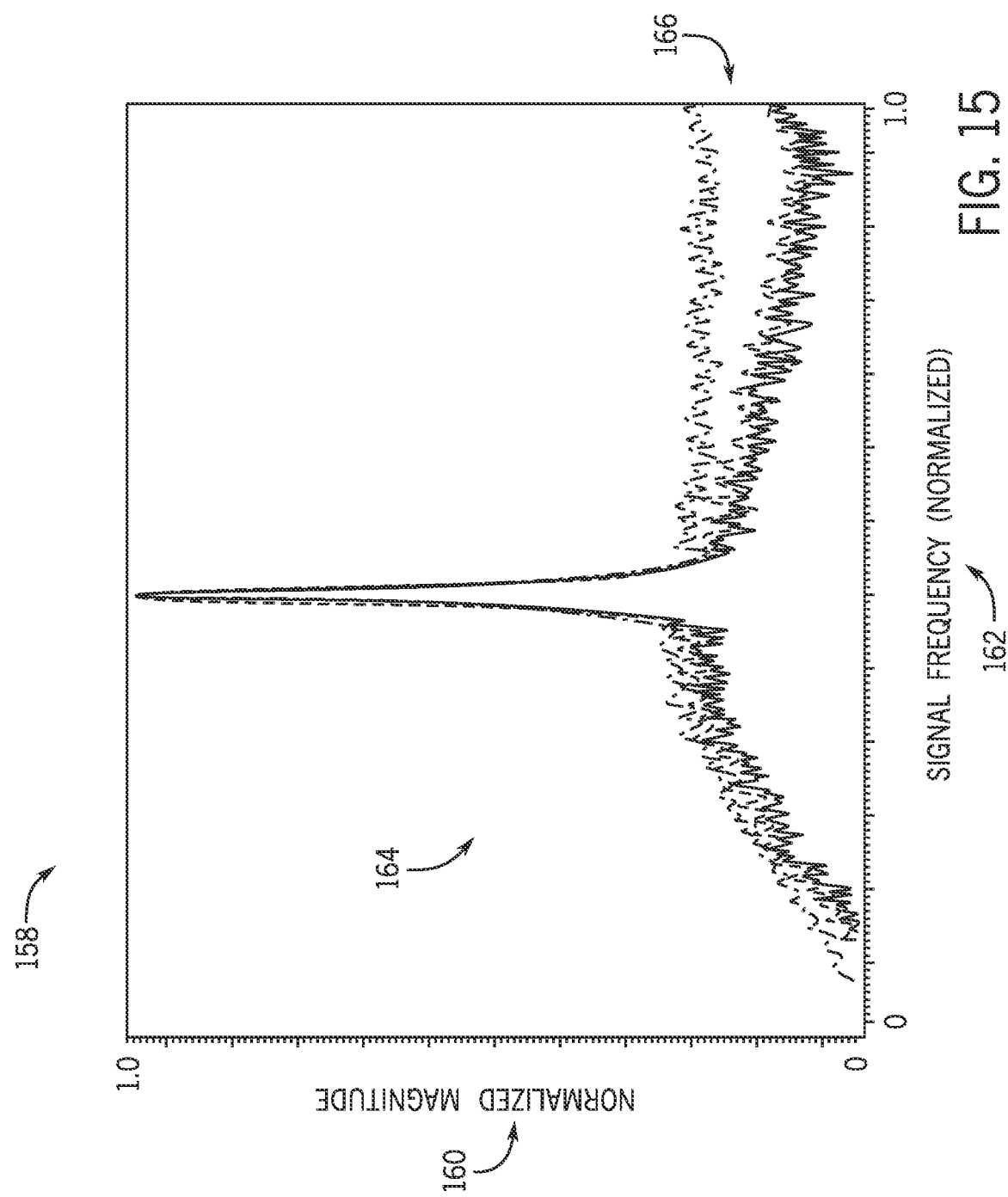
FIG. 15 is a graph of frequency response of an analog output signal of the fractal digital-to-analog converter of FIG. 6 with different fill orders, in accordance with an embodiment of the present disclosure.

In some embodiments, the fill controller 132 may run through any number (e.g., 10, 1,000, 1,000,000, etc.) of different alternative fill orders 154 during testing. In some embodiments, the analog output signals 64 of the different fill orders may be analyzed, as exampled in the graph 158 of FIG. 15, with normalized magnitude 160 on the y-axis and signal frequency 162 on the x-axis. The signal response 164 for some fill orders may result in decreased noise. As such, an optimized or reduced noise fill order may be utilized to provide increased quality analog output signals 64. As should be appreciated, different quality parameters such as signal response, signal-to-noise ratio, and/or linearity may be used to determine which fill orders are most appropriate for a given situation.

Figure 16:
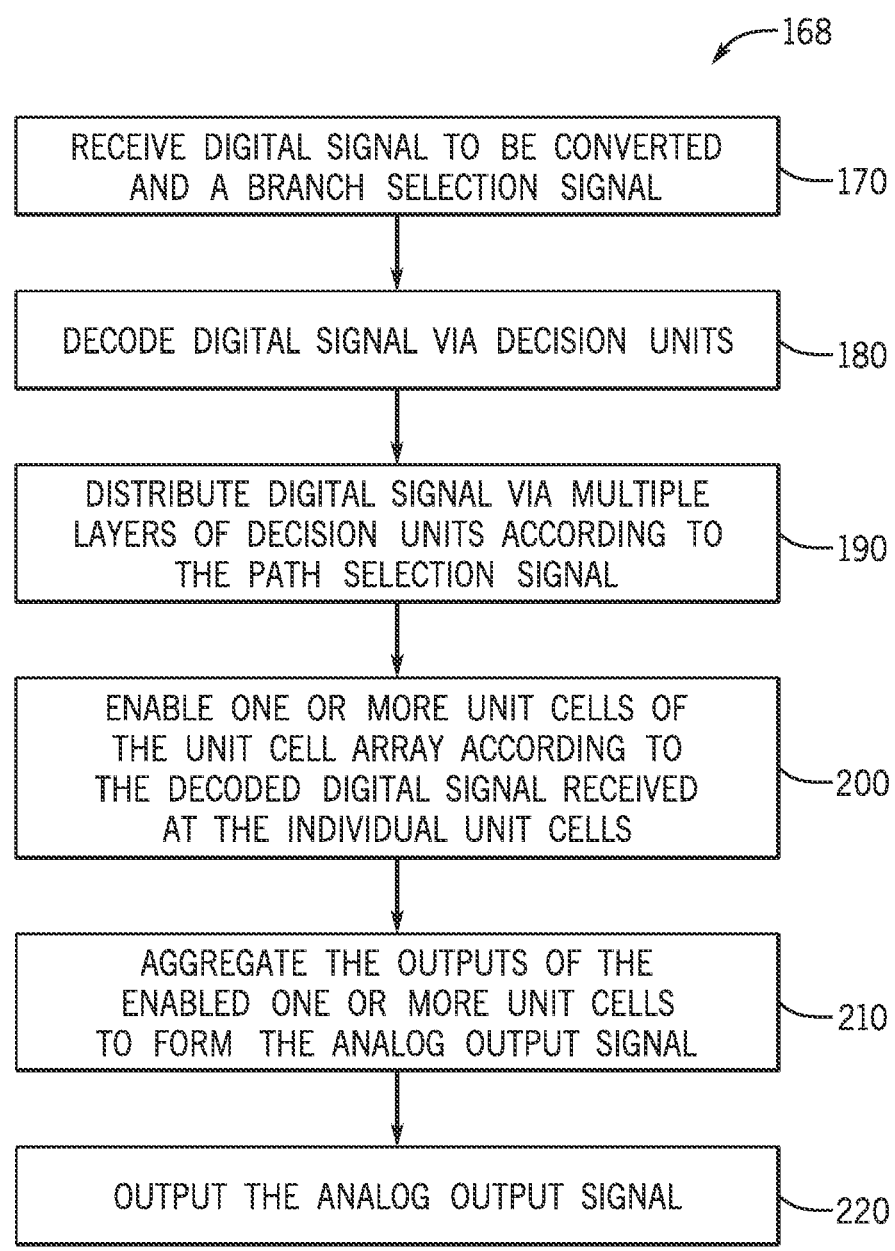
FIG. 16 is a flowchart of a method for converting a digital signal to an analog signal using the fractal digital-to-analog converter of FIG. 6, in accordance with an embodiment of the present disclosure.

FIG. 16 is a flowchart of a method 168 of an example process for operation of the fractal DAC 100. The fractal DAC 100 may receive a digital signal 56 to be converted to an analog output signal 64 and a branch selection signal 134 (process block 170). Additionally, the digital signal 56 may be decoded by decision units 106 of the fractal DAC 100 (process block 180). The digital signal 56, while being decoded by the decision units 106, may be distributed throughout the fractal DAC 100 according to the branch selection signal 134 (process block 190). For example, each decision unit 106 may direct a LSB signal 112 to a first output branch 136 and a MSB signal 110 to a second output branch 136, or vice versa, based on the branch selection signal. The fractal DAC 100 may also enable one or more unit cells 102 of the unit cell array 124 according to the decoded digital signal 56 received at the individual unit cells 102 (process block 200). For example, the decision units 106 may decode the digital signal 56 from binary to thermometer code such that each unit cell 102 receives an activation or deactivation signal. The fractal DAC 100 may then aggregate the outputs of the unit cells 102 that are enabled to form the analog output signal 64 (process block 210) and output the analog output signal 64 (process block 220).

As discussed above, by providing a programmable fill order (e.g., via the decision units 106), the fractal DAC 100 may have increased linearity, decreased noise, and/or may provide for increased manufacturing efficiency. Although the above referenced flowcharts and are shown in a given order, in certain embodiments, process blocks may be reordered, altered, deleted, and/or occur simultaneously. Additionally, the referenced flowcharts and are given as illustrative tools and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A digital to analog converter (DAC) comprising:
a plurality of unit cells;
a data path configured to transmit one or more activation signals to a set of unit cells of the plurality of unit cells; and
path selection circuitry configured to select the set of unit cells from the plurality of unit cells.

2. The DAC of claim 1, comprising decoding circuitry configured to receive a digital signal and generate the one or more activation signals based on the digital signal, the digital signal indicating a number of unit cells in the set of unit cells.

3. The DAC of claim 2, comprising a decision unit comprising a first portion of the path selection circuitry and a second portion of the decoding circuitry, the decision unit configured to:
receive the digital signal or a partially decoded portion of the digital signal and generate a first output and a second output based on the digital signal or the partially decoded portion of the digital signal; and
selectively, direct the first output to a first branch of the data path and the second output to a second branch of the data path, or direct the first output to the second branch and the second output to the first branch, based on a branch selection signal.

4. The DAC of claim 3, wherein the first output comprises an activation signal of the one or more activation signals.

5. The DAC of claim 3, comprising a fill controller configured to generate the branch selection signal.

6. The DAC of claim 5, wherein the fill controller is configured to set a fill order of the plurality of unit cells, the branch selection signal being based on the fill order, and wherein the fill order defines the set of unit cells.

7. The DAC of claim 1, wherein respective unit cells of the plurality of unit cells are configured to generate respective portions of an analog output signal of the DAC based on respective activation signals of the one or more activation signals.

8. The DAC of claim 1, wherein the data path comprises a branching fractal layout disposed within an array of the plurality of unit cells.

9. The DAC of claim 1, wherein the DAC comprises a column and line DAC.

10. A method comprising:
directing, via a data path of a digital-to-analog converter (DAC), one or more activation signals to one or more unit cells of a plurality of unit cells of the DAC;
receiving, via path selection circuitry of the DAC, a fill order signal; and
selecting, via the path selection circuitry, the one or more unit cells to receive the one or more activation signals based on the fill order signal.

11. The method of claim 10, wherein the fill order signal comprises a branch selection signal, the path selection circuitry being configured to selectively direct an activation signal of the one or more activation signals to either a first unit cell of the one or more unit cells or a second unit cell of the one or more unit cells based on the branch selection signal.

12. The method of claim 10, comprising generating, via a fill controller, the fill order signal.

13. The method of claim 12, wherein the fill controller is configured to generate the fill order signal based on an environmental parameter of the DAC.

14. The method of claim 10, comprising:
determining one or more properties of a first analog output signal of the DAC indicative of a digital input signal and corresponding to the fill order signal;
determining the one or more properties of a second analog output signal of the DAC indicative of the digital input signal and corresponding to a second fill order signal, different than the fill order signal; and
setting a fill order of the DAC based on the one or more properties of the first analog output signal and the one or more properties of the second analog output signal.

15. The method of claim 14, wherein the one or more properties comprise linearity, noise, or both.

16. The method of claim 10, comprising decoding, via decoding circuitry, a digital signal indicative of an analog output of the DAC to generate the one or more activation signals.

17. The method of claim 16, comprising aggregating respective outputs of the one or more unit cells to generate the analog output.

18. Transceiver circuitry comprising:
a digital-to-analog converter (DAC) configured to generate an analog signal based on a digital signal, the DAC comprising a plurality of unit cells and path selection circuitry, wherein the path selection circuitry is configured to select a set of unit cells of the plurality of unit cells to activate based on a fill order signal, the digital signal corresponds to a number of unit cells in the set of unit cells, and the fill order signal corresponds to the set of unit cells; and
one or more antennas coupled to the DAC, the one or more antennas configured to transmit a radio frequency (RF) signal based on the analog signal.

19. The transceiver circuitry of claim 18, wherein the DAC comprises a branching data path, the path selection circuitry configured to select branches of the branching data path to receive activation signals.

20. The transceiver circuitry of claim 19, wherein the DAC comprises a decision unit at each branch point of the branching data path, the decision unit at each branch point comprising at least a portion of the path selection circuitry and decoding circuitry configured to decode, at least in part, the digital signal into the activation signals.

* * * * *